United States Patent
Lu et al.

(10) Patent No.: US 11,648,639 B2
(45) Date of Patent: May 16, 2023

(54) POLISHING JIG ASSEMBLY FOR A NEW OR REFURBISHED ELECTROSTATIC CHUCK

(71) Applicant: Applied Materials, Inc., Santa Clara, CA (US)

(72) Inventors: William Ming-ye Lu, Sunnyvale, CA (US); Wendell Glenn Boyd, Jr., Morgan Hill, CA (US); Stacy Meyer, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/457,423

(22) Filed: Dec. 2, 2021

(65) Prior Publication Data

US 2022/0088743 A1 Mar. 24, 2022

Related U.S. Application Data

(63) Continuation of application No. 14/341,419, filed on Jul. 25, 2014, now Pat. No. 11,260,498.
(Continued)

(51) Int. Cl.
*B24B 37/04* (2012.01)
*B24B 37/32* (2012.01)
*H01L 21/683* (2006.01)

(52) U.S. Cl.
CPC ............ *B24B 37/044* (2013.01); *B24B 37/32* (2013.01); *H01L 21/6831* (2013.01)

(58) Field of Classification Search
CPC ....... B24B 37/044; B24B 37/32; B24B 41/06; H01L 21/6833; H01L 2221/683; B32B 38/10
See application file for complete search history.

(56) References Cited

U.S. PATENT DOCUMENTS

| 5,861,086 A | * | 1/1999 | Khurana | ................. H01J 37/34 204/298.34 |
| 6,102,777 A | | 8/2000 | Duescher et al. | |

(Continued)

FOREIGN PATENT DOCUMENTS

| CN | 1694784 A | 11/2005 |
| JP | H07221168 A | 8/1995 |

(Continued)

OTHER PUBLICATIONS

Office Action for Chinese Patent Application No. 201480043641.3 dated Jan. 24, 2018.
(Continued)

*Primary Examiner* — Joel D Crandall
(74) *Attorney, Agent, or Firm* — Patterson + Sheridan, LLP

(57) ABSTRACT

Embodiments of the present invention provide a polishing ring assembly suitable for polishing an electrostatic chuck and method of using the same. In one embodiment, the polishing ring assembly has a retaining ring assembly and an electrostatic chuck fixture. The retaining ring assembly includes an inner diameter and a top surface, a plurality of outer drive rings wherein the plurality of outer drive rings are placed on the top surface of the ceramic retaining ring. The electrostatic chuck fixture includes an electrostatic chuck drive plate adjacent to the inner diameter of in the ceramic retaining ring. The electrostatic chuck drive plate has a lock to secure retaining ring assembly with the electrostatic chuck fixture without transferring the weight from one assembly over to the other through the locking mechanism.

16 Claims, 6 Drawing Sheets

Related U.S. Application Data

(60) Provisional application No. 61/864,525, filed on Aug. 10, 2013.

(56) References Cited

U.S. PATENT DOCUMENTS

| | | | |
|---|---|---|---|
| 2007/0102286 A1 | | 5/2007 | Scheible et al. |
| 2008/0217291 A1 | | 9/2008 | Higuma et al. |
| 2009/0056112 A1 | | 3/2009 | Kobayashi |
| 2011/0180983 A1* | | 7/2011 | Arun ................ H01J 37/32495 269/86 |

FOREIGN PATENT DOCUMENTS

| | | | |
|---|---|---|---|
| JP | H10094958 A | | 4/1998 |
| JP | 2009094166 A | | 4/2009 |
| KR | 20010063395 A | | 7/2001 |
| KR | 20050080246 A | | 8/2005 |
| KR | 20070046765 A | | 5/2007 |
| KR | 20080076802 A | * | 10/2008 |
| KR | 20120130851 A | | 12/2012 |
| TW | 1240351 B | | 9/2005 |

OTHER PUBLICATIONS

Office Action for Taiwan Patent Application No. 103117922 dated Feb. 21, 2018.

Office Action for Korean Patent Application No. 10-2016-7006172 dated Jul. 23, 2020.

Notice of Allowance for Korean Patent Application No. 10-2016-7006172 dated Jan. 6, 2021.

* cited by examiner

POLISHING JIG ASSEMBLY FOR A NEW OR REFURBISHED ELECTROSTATIC CHUCK

CROSS-REFERENCE TO RELATED APPLICATIONS

This application is a continuation of and claims benefit of U.S. patent application Ser. No. 14/341,419, filed on Jul. 25, 2014 and U.S. Provisional Application Ser. No. 61/864,525, filed Aug. 10, 2013, both of which are incorporated by reference in their entirety.

BACKGROUND OF THE INVENTION

Field of the Invention

Embodiments disclosed herein generally relate to an apparatus and a method for preparing an electrostatic chuck for use in a semiconductor processing chamber.

Description of the Related Art

Semiconductor processing involves a number of different chemical and physical processes whereby minute integrated circuits are created on a substrate. Layers of materials which make up the integrated circuit are created by chemical vapor deposition, physical vapor deposition, epitaxial growth, and the like. Some of the layers of material are patterned using photoresist masks and wet or dry etching techniques. The substrate utilized to form integrated circuits may be silicon, gallium arsenide, indium phosphide, glass, or other appropriate material.

A typical semiconductor processing chamber includes a chamber body defining a process zone, a gas distribution assembly adapted to supply a gas from a gas supply into the process zone, a gas energizer, e.g., a plasma generator, utilized to energize the process gas to process a substrate positioned on a substrate support assembly, and a gas exhaust. The substrate support assembly may include a chuck that holds the substrate to the substrate support assembly during processing. One example of a commonly used chuck in semiconductor processing chambers is an electrostatic chuck. The quality and performance of the electrostatic chuck has a significant effect on substrate device performance and yield. The electrostatic chuck also provides a backside gas flows below the substrate to help maintain the temperature of the substrate during processing. The edge of the electrostatic chuck has a seal for preventing backside gas from escaping from underneath the substrate. However, the leak rate for the backside gas, even for new electrostatic chucks, is at times unacceptable.

FIG. 1 illustrates a conventional electrostatic chuck 100. The electrostatic chuck 100 includes a puck 120 and an aluminum plate 130. The puck 120 has a bottom surface 131 and a top surface 121. The top surface 121 supports the substrate during processing. The aluminum plate 130 has a bottom surface 132 and a top surface 122. During assembly of the electrostatic chuck 100, a bond 140 is formed between the bottom surface 131 of the puck 120 and the top surface 122 of the aluminum plate 130 to attach the puck 120 to the aluminum plate 130. However, the bond 140 often causes the top surface 121 of the puck 120 to bow (as illustrated by reference numeral 145).

During plasma processing, a flat substrate (not shown) makes contact with and forms a seal along the outside edge 147 of the puck 120. However, the bow 145 in the puck 120 often results in the failure of the flat substrate from maintaining continuous contact with the outside edge 147, thus preventing a good seal from being established between the puck 120 and substrate, while increasing the leak rate of cooling gases flowing out from between the substrate and the puck 120. Excessive cooling gas leakage increases the defect rate for the substrates being processed on the top surface 121 of the puck 120. However, attempts to remove the bow 145 from the puck 120 results in rounding the edges 147 of the top surface 121, which disadvantageously increases the leak rate for the cooling gases.

During plasma processing, the energized gas is often comprised of highly corrosive species which etch and erode the exposed portions of the electrostatic chuck 100. If the electrostatic chuck 100 has rounded edges from attempts to remove the bow, the electrostatic chuck may need to be serviced more frequently.

Therefore, there is a need for improving the backside gas seal on an electrostatic chuck.

SUMMARY OF THE INVENTION

Embodiments of the present invention provide a polishing ring assembly suitable for polishing an electrostatic chuck and method of using the same. In one embodiment, the polishing ring assembly has a retaining ring assembly and an electrostatic chuck fixture. The retaining ring assembly includes an inner diameter and a top surface, a plurality of outer drive rings wherein the plurality of outer drive rings are placed on the top surface of the ceramic retaining ring. The electrostatic chuck fixture includes an electrostatic chuck drive plate adjacent to the inner diameter of in the ceramic retaining ring. The electrostatic chuck drive plate has a lock to secure retaining ring assembly with the electrostatic chuck fixture without transferring the weight from one assembly over to the other through the locking mechanism.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

Figure 1:
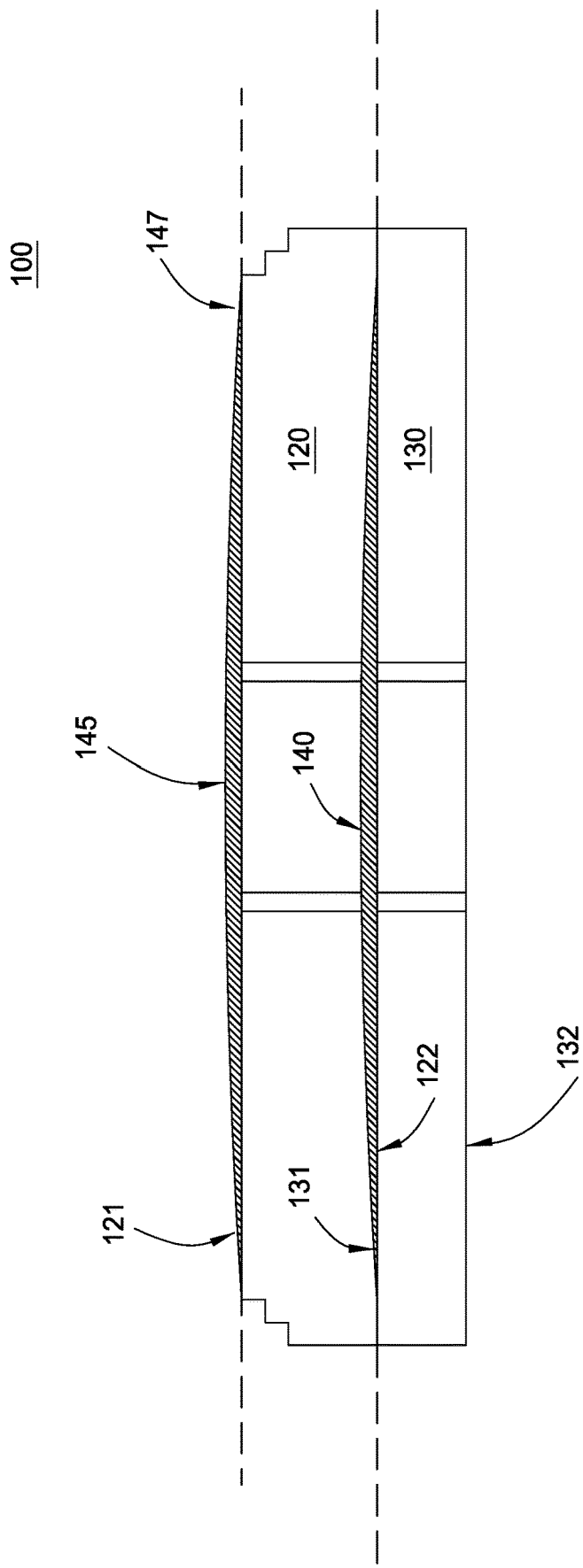
FIG. 1 is a cross-sectional view of a conventional electrostatic chuck.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that elements of one embodiment may be advantageously utilized in other embodiments without further recitation.

DETAILED DESCRIPTION

Embodiments disclosed herein generally relate to improving the seal between an electrostatic chuck and a substrate placed thereon. The improved seal reduces the leak rate of backside cooling gas, such as Helium, which flows between the electrostatic chuck and the substrate. The electrostatic chuck is planarized and polished to provide a smooth sealing surface along an outer sealing band of the electrostatic chuck and the substrate. The smooth planar surface of the seal band increases the amount of the seal band surface which contacts the substrate and creates the seal. Thus, an improved seal is provided between the seal band and the substrate. The improved seal reduces the cooling gas leak rate, thereby reducing substrate manufacturing defects and improving the service life of the substrate support assembly while reducing maintenance and manufacturing cost.

Figure 2:
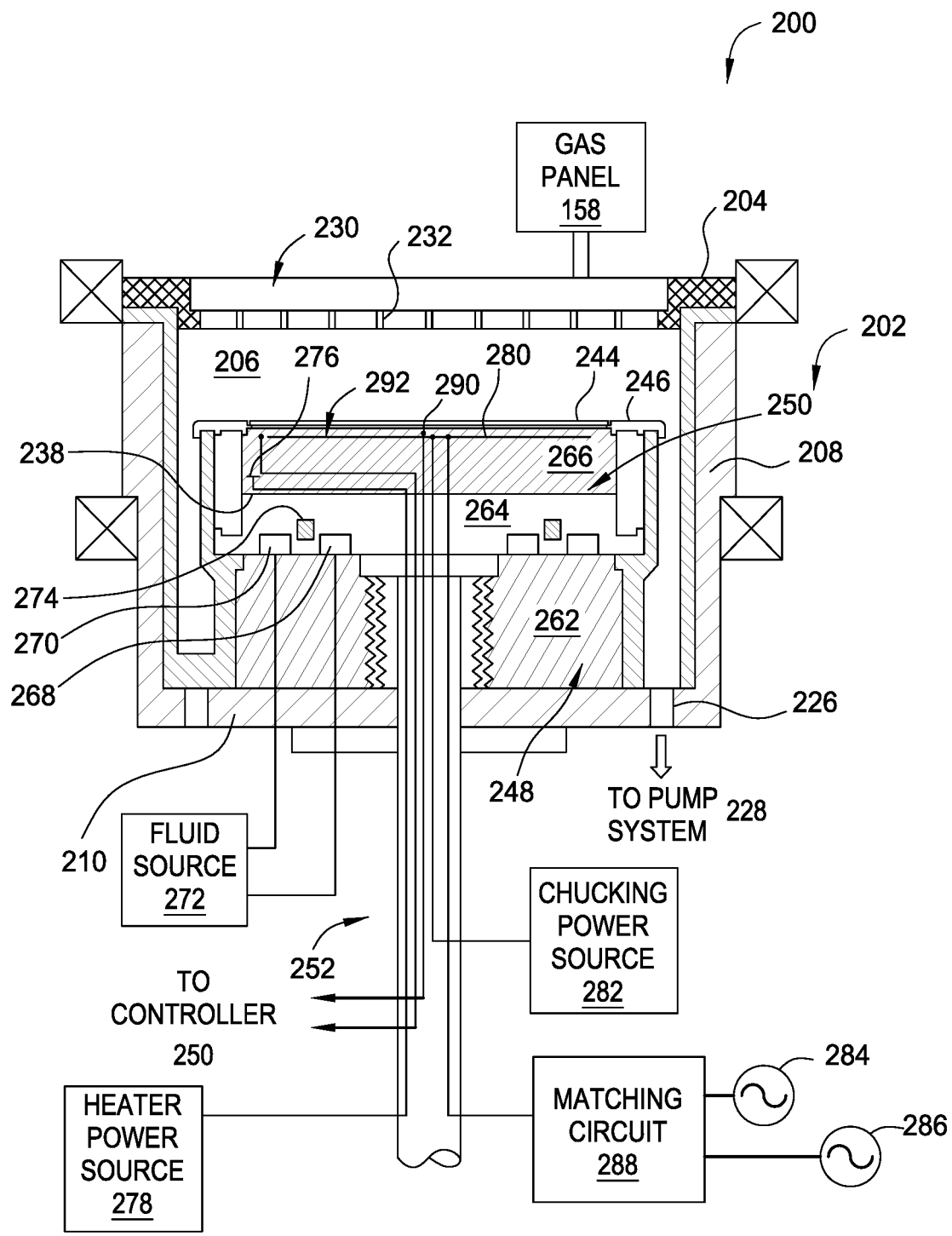
FIG. 2 is a cross-sectional view of an exemplary semiconductor processing chamber having one embodiment of a polished electrostatic chuck.

FIG. 2 is a cross-sectional view of an exemplary semiconductor processing chamber 200 having one embodiment of a polished electrostatic chuck 250 disposed therein. Although one embodiment of the electrostatic chuck 250 is described herein, it is contemplated that electrostatic chucks having other configurations may be adapted to benefit from the invention.

The processing chamber 200 includes a chamber body 202 and a lid 204 that encloses an interior volume 206. The chamber body 202 is typically fabricated from aluminum, stainless steel or other suitable material. The chamber body 202 generally includes sidewalls 208 and a bottom 210. A substrate access port (not shown) is generally defined in the sidewall 208 and a selectively sealed by a slit valve to facilitate entry and egress of a substrate 244 from the processing chamber 200. The dimensions of the chamber body 202 and related components of the processing chamber 200 are not limited and generally are proportionally larger than the size of the substrate 244 to be processed. Examples of substrate sizes include substrates having 150 mm diameter, 200 mm diameter, 300 mm diameter and 450 mm diameters, among others.

An exhaust port 226 is defined in the chamber body 202 and couples the interior volume 206 to a pump system 228. The pump system 228 generally includes one or more pumps and throttle valves utilized to evacuate and regulate the pressure of the interior volume 206 of the processing chamber 200. In one embodiment, the pump system 228 maintains the pressure inside the interior volume 206 at operating pressures typically between about 10 mTorr to about 20 Torr.

The lid 204 is supported on the sidewall 208 and seals the chamber body 202. The lid 204 may be opened to allow excess to the interior volume 206 of the processing chamber 200. A gas panel 258 is coupled to the processing chamber 200 to provide process and/or cleaning gases to the interior volume 206 through a gas distribution assembly 230. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, other gases inert to the process and non-reactive gases. The gas distribution assembly 230 may having a plurality of apertures 232 on the downstream surface of the gas distribution assembly 230 to direct the gas flow to the surface of the substrate 244. The gas distribution assembly 230 may be fabricated and/or coated by a ceramic material, such as silicon carbide, bulk Yttrium or oxide thereof to provide resistance to halogen-containing chemistries and prevent the gas distribution assembly 230 from corrosion.

A substrate support assembly 248 is disposed in the interior volume 206 of the processing chamber 200 below the gas distribution assembly 230. The substrate support assembly 248 holds the substrate 244 during processing. The substrate support assembly 248 generally includes a plurality of lift pins (not shown) disposed therethrough that are configured to lift the substrate 244 from the substrate support assembly 248 and facilitate exchange of the substrate 244 with a robot (not shown) in a conventional manner.

In one embodiment, the substrate support assembly 248 includes a mounting plate 262 a pedestal 252, and the electrostatic chuck 250. The electrostatic chuck 250 further includes a base 264 and a puck 266. The mounting plate 262 is coupled to the bottom 210 of the chamber body 202 and includes passages for routing utilities, such as fluids, power lines and sensor leads, among others, to the base 264 and the puck 266.

The puck 266 comprises at least one clamping electrode 280 controlled by a chucking power source 282 positioned external to the processing chamber 200. The electrode 280 (or other electrode disposed in the puck 266 or base 264) may further be coupled to one or more RF power sources 284, 286 through a matching circuit 288 for maintaining a plasma formed from process and/or other gases within the processing chamber 200. The power sources 284, 286 are generally capable of producing RF signal having a frequency from about 50 kHz to about 3 GHz and a power of up to about 10,000 Watts.

At least one of the base 264 or puck 266 may include at least one optional embedded heater 276, at least one optional embedded isolator 274 and a plurality of conduits 268, 270 to control the lateral temperature profile of the substrate support assembly 248. The conduits 268, 270 are fluidly coupled to a fluid source 272 that circulates a temperature regulating fluid therethrough. The embedded isolator 274 is disposed between the conduits 268, 270. The heater 276 is regulated by a power source 278. The conduits 268, 270 and heater 276 are utilized to control the temperature of the base 264, thereby heating and/or cooling the puck 266. The temperature of the puck 266 and the base 264 may be monitored using a plurality of temperature sensors 290, 292.

Figure 3:
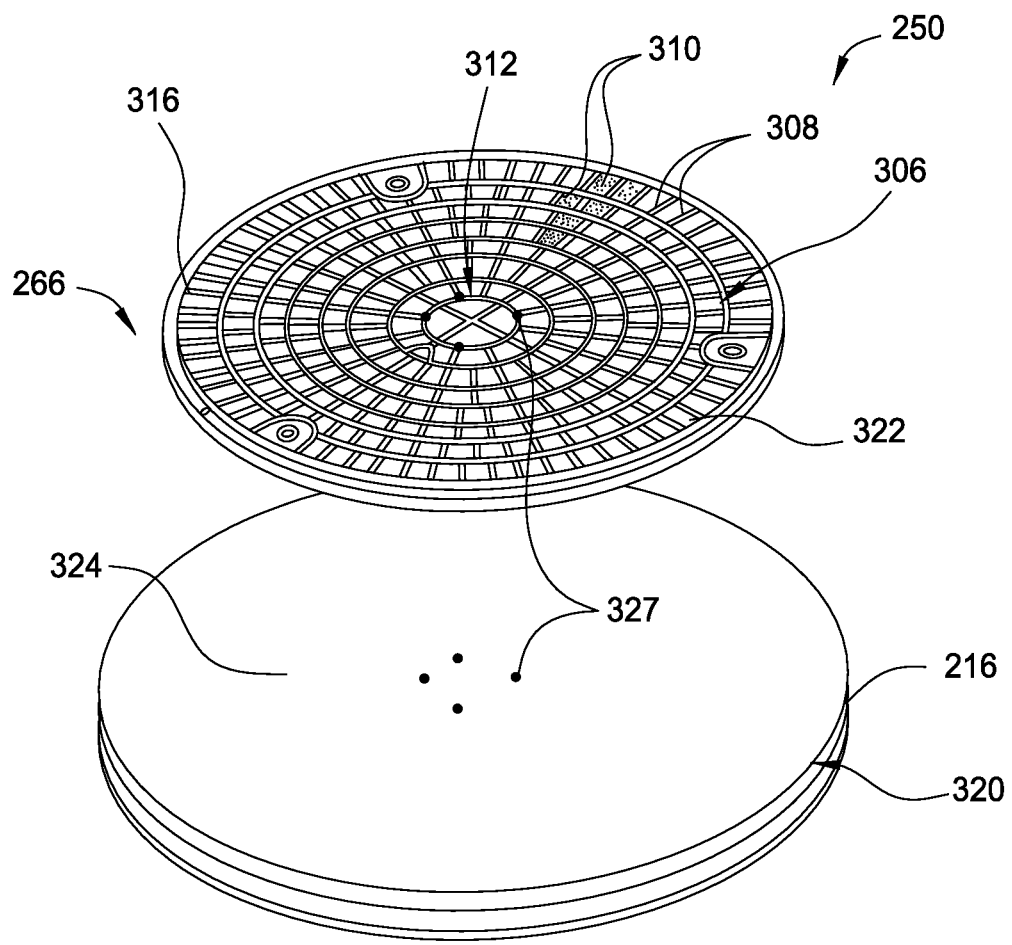
FIG. 3 is a exploded perspective view of the polished electrostatic chuck shown in FIG. 2.

FIG. 3 is an exploded perspective view of the polished electrostatic chuck 250 shown in FIG. 2. The electrostatic chuck 250 includes the puck 266 and the base 264 attached to the puck 266. The puck 266 has a disc-like shape with an annular periphery 322 that substantially matches the shape and size of the substrate (not shown) positioned thereon. The puck 266 may further comprise a sealing band 316, plurality of mesa's 310 and gas passages 308. The gas passages 308, such as grooves, that are formed in a frontside surface 306 of the puck 266 are fluidly coupled to a source of a heat transfer (or backside) gas, such as He. The gas passages 308 include radial channels that have about 5 degrees to about 10 degrees spacing and terminate in an inner circular groove 312. In operation, the backside gas may be provided into the gas passages 308 to enhance the heat transfer between the puck 266 and the substrate 244 through a plurality of backside gas conduits 327. The sealing band 316 may be on the annular periphery 322 of the puck 266, for example, about 1.5 mm from the outer edge 323, and provides a seal between the substrate 244 and puck 266 to prevent the backside gas in the gas passages 308 from excessively escaping into the interior volume 206 of the processing chamber 200.

In one embodiment, the puck 266 may be fabricated from a ceramic material. Suitable examples of the ceramic materials include aluminum oxide ($Al_2O_3$), aluminum nitride (AlN), titanium oxide (TiO), titanium nitride (TiN), silicon carbide (SiC) and the like. In another embodiment, the puck 266 may be fabricated by a ceramic material containing rare earth metal. In yet another embodiment, the puck 266 may be fabricated by $Y_2O_3$.

The base 264 has a disc-like main portion 324 and an annular flange 320 extending outwardly from a main portion 324 and is attached below the puck 266. The base 264 may be fabricated by a material having thermal properties substantially matching that of the overlying puck 266. In one embodiment, the base 264 may be fabricated by a metal, such as aluminum or stainless steel or other suitable materials. Alternatively, the base 264 may be fabricated by a composite of ceramic and metal material providing good strength and durability as well as heat transfer properties. The composite material has a thermal expansion coefficient that may be substantially matched to the overlying puck 266 to reduce a mismatch of thermal expansion and mitigate warping of the electrostatic chuck 250 or separation of the base 264 and puck 266. In yet another embodiment, the base 264 may be fabricated by a composite material which may include a different composition of a ceramic and metal, such as metal having dispersed ceramic particles.

Referring back to FIG. 2, the base 264 may be coupled to the puck 266 by a bonding material 238. The bonding material 238 facilitates thermal energy exchange between the puck 266 and the base 264 and reduces the thermal expansion mismatch therebetween. In one exemplary embodiment, the bonding material 238 mechanically bonds the base 264 to the puck 266. In another embodiment, the bonding material 238 may be a thermal conductive paste or tape having at least one of an acrylic based compound and silicon based compound. In yet another embodiment, the bonding material 238 may a thermal conductive paste or tape having at least one of an acrylic based compound and silicon based compound with metal or ceramic fillers mixed or added thereto. The metal filler may be at least one of Al, Mg, Ta, Ti, or combination thereof and the ceramic filler may be at least one of aluminum oxide ($Al_2O_3$), aluminum nitride (AlN), titanium diboride ($TiB_2$) or combination thereof.

After bonding the puck 266 to the base 265 with the bonding material 238, the surface of the electrostatic chuck 250 may become bowed and may no longer be planarized, increasing the probability of cooling gas leakage. Additionally, during plasma processing, the energized gas is often comprised of highly corrosive species which etches and erodes exposed portions of the substrate support assembly. In particular, the erosion of the sealing band is problematic for maintaining an effective seal for the cooling gasses.

The current conventional practice for improving the sealing properties of the sealing band is to polish the band using hard ceramic plates in conjunction with a slurry to reduce the surface roughness of the sealing band 316, thereby enhancing the contact between the substrate and electrostatic chuck. However, polishing with hard ceramic polishing plates do not provide a robust sealing surface. The inventors have discovered that an ultra smooth sealing surface finish may be achieved by polishing the band with a soft pad. However, soft pads tend to round the sealing band 316 and the outer edge 323 of the electrostatic chuck 250 resulting in non-planarity of the frontside surface 306 for the electrostatic chuck 250, and as such, provide poor sealing between the electrostatic chuck 250 and substrate, thereby allowing undesirable cooling gas leakage. To prevent the rounding of the outer edge 323 and sealing band 316 of the electrostatic chuck 250 while polishing the sealing surfaces with a soft pad, such as a polyurethane polishing pad, to provide an ultra smooth finish, the inventors have discovered that a polishing ring assembly mitigates rounding, thus providing a robust sealing surface that extends the service life of the electrostatic chuck 250.

Figure 4:
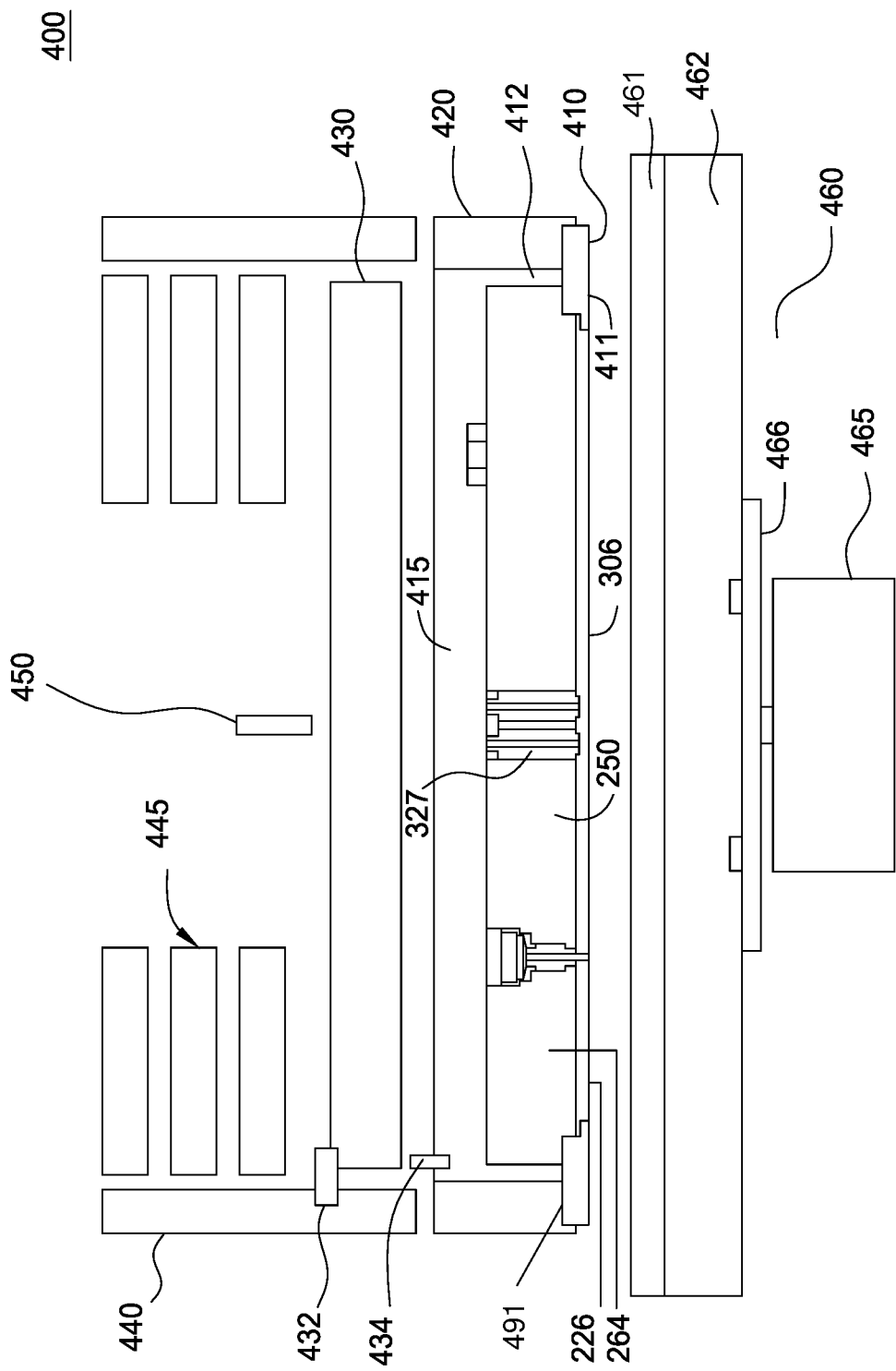
FIG. 4 illustrates a polishing ring assembly for planarizing and polishing the electrostatic chuck.

FIG. 4 illustrates a polishing ring assembly 400 for planarizing and polishing the electrostatic chuck 250 which produces the robust sealing surface described above. The electrostatic chuck 250, with the base 264 and bonded puck 266, may be processed using the polishing ring assembly 400 to either improve new, unused chucks, or to enhance the performance of refurbished chucks prior to reuse. The polishing ring assembly 400 holds the electrostatic chuck 250 while the chuck 205 is planarized on a polisher 460. The polishing ring assembly 400 has a retaining ring assembly and an electrostatic chuck fixture. The polishing retaining assembly includes a ceramic retaining ring 410, and an outer drive ring 420. The electrostatic chuck fixture includes an electrostatic chuck drive plate 430, a purging fixture 415, a plurality of outer weights 440 and a plurality of inside weights 445. The polishing ring assembly 400 controls the location and motion of the electrostatic chuck 250 as it is planarized on the polisher 460.

The polisher 460 has a motor 465 coupled by an interconnect 466 to a platen 462 on which a polishing pad 461 resides. The polishing pad 461 may be circular in shape and has a dimension larger than that of the polishing ring assembly 400.

A top surface 411 of the ceramic retaining ring 410 may be coplanar with the frontside surface 306. The outer drive ring 420 is deposed on top of the ceramic retaining ring 410 and along an outside periphery 412 of the purging fixture 415. The electrostatic chuck drive plate 430 may be stacked on top of the electrostatic chuck 250 and includes a locking mechanism 480 which interlocks with the electrostatic chuck 250 and the plurality of outer weights 440. The locking mechanism 480 secures the retaining ring assembly with the electrostatic chuck fixture without transferring the weight from one assembly over to the other through the locking mechanism 480. The locking mechanism 480 may be in the form of a plurality of drive pins 434 and drive keys 432, or other device suitable to secure the electrostatic chuck 250 and outer weights 440. Each drive pin 434 may respectively engage a first aperture 433, such as a hole or slot, in the electrostatic chuck drive plate 430 and a second aperture 445 in the purging fixture 415 to lock the orientation of the electrostatic chuck drive plate 430 with the purging fixture 415. Additionally, each drive key 432 may respectively engage a first opening 437, such as a hole or slot, in the electrostatic chuck drive plate 430 and a second opening 431 in the weights 440 to lock the orientation of the electrostatic chuck drive plate 430 with the weights 440. Thus, the locking mechanism 480 secures the electrostatic chuck drive plate 430, weights 440 and the purging fixture 415 together. The additional inside weights 445 are placed on top of the electrostatic chuck drive plate 430. The weights 445, 440 provide a fixed, i.e., predefined, pressure forcing the electrostatic chuck 250 against the polishing pad 461. Alternatively, the electrostatic chuck drive plate 430 may have drive keys which may not lock. Additionally, the ceramic retaining ring 410 may not lock as well. The ESC assembly may rotate slightly off center due to movement in the assembly. However, small clearances ensure little effect on the end polishing results.

The polishing pad 461 may include grooves of sufficient depth and width to permit the flow of deionized water through the grooves while substrate is urged against the polishing pad 461. Deionized water may be pumped in from the backside of the electrostatic chuck 250 by a connection 450 to the center of the electrostatic chuck drive plate 430 which is fluidly connected to the backside gas conduits 327. The connection 450 provides approximately 400 to 450 ml/minute of deionized water exiting out the backside gas conduits 327 on the frontside surface 306 of the electrostatic chuck 250. The constant water flow prevents dislodged diamond particles, loose pad material, and removed electrostatic chuck materials from entering into the backside gas conduits 327 of the electrostatic chuck.

The ceramic retaining ring 410 spaces the displaced wave of pad material from interfacing with the substrate while polishing. Thus, the polishing pad 461 is substantially planar when contacting the edge of the substrate. In one embodiment, the ceramic retaining ring 410 may be made of ceramic, such as 99 percent $Al_2O_3$ for longer wear life. During processing of the electrostatic check 250 on the polishing pad 461, the ceramic retaining ring 410 may exert equivalent pressure on the polishing pad 461, or the ceramic retaining ring 410 may exert slightly lower pressure on the polishing pad 461 of about 2 PSI to about 3 PSI. In this manner the ceramic retaining ring 410 controls the pad deformation and reduces tendencies of the polishing pad 461 to vary inward of the ceramic retaining ring 410, thus providing a substantially flat and planar surface on which to polish the electrostatic chuck 250, thereby providing robust polishing of the frontside surface 306 without rounding along the edge.

Figure 5:
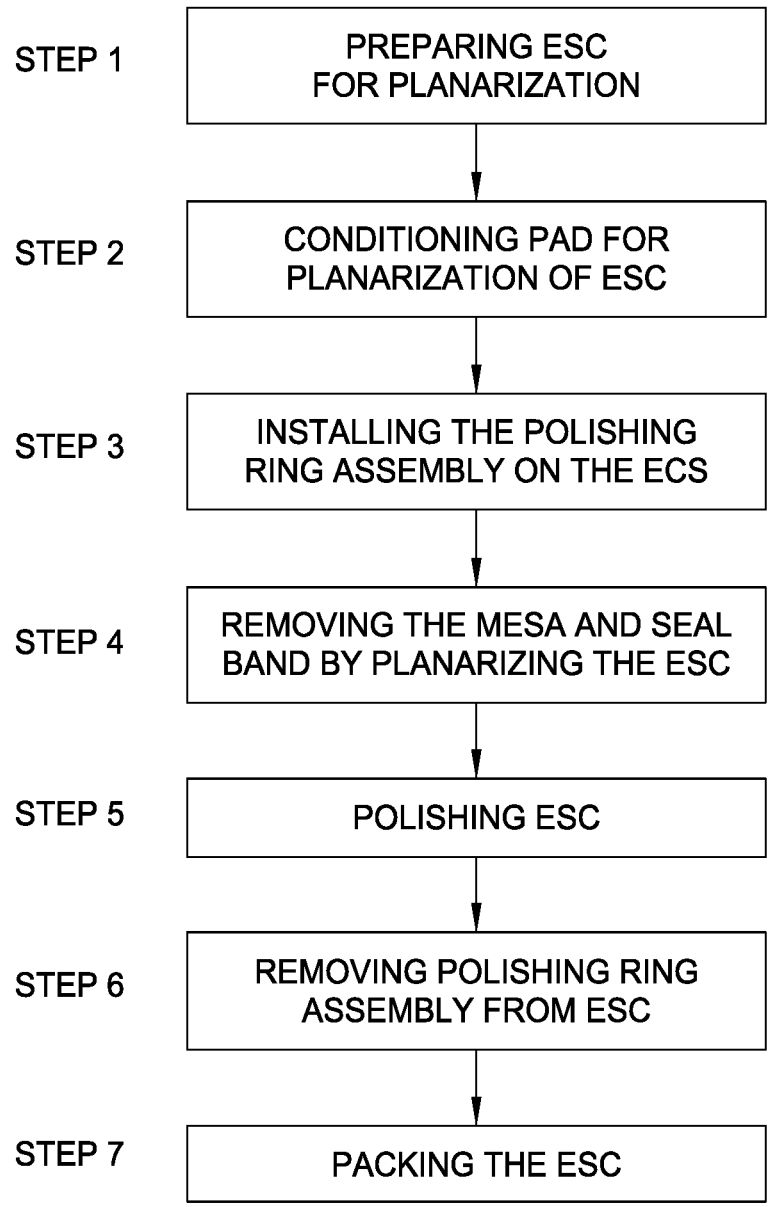
FIG. 5 illustrates a method for preparing the electrostatic chuck for refurbishing.
Figure 6:
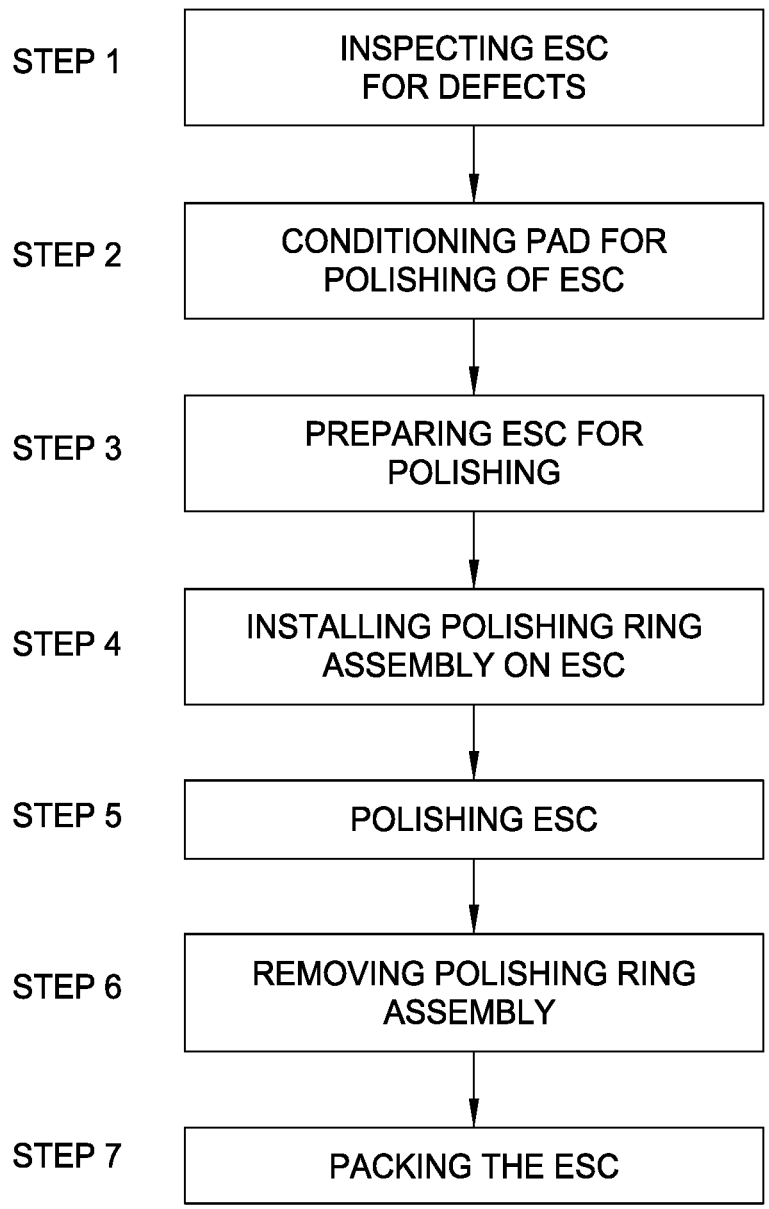
FIG. 6 is a method for polishing the electrostatic chuck.

The polishing ring assembly 400 may be utilized using the methods described in FIG. 5 and FIG. 6 for refurbishing a used electrostatic chuck, such as the electrostatic chuck 250. FIG. 5 is a method 500 for preparing the electrostatic chuck 250 for refurbishing. FIG. 6 is a method 600 for polishing either a new or refurbished electrostatic chuck 250 for improving the backside gas seal.

The top surface of the electrostatic chuck 250 contains features such as mesa's 310, the sealing band 316, and gas passages 308 as seen on the frontside surface 306 of the electrostatic chuck 250 shown in FIG. 3. In some refurbishing processes, the mesa 310 and the sealing band 316 of the electrostatic chuck 150 may be removed by planarizing the frontside surface 306 to a flatness specification. If not properly done, the electrostatic chuck may have large rounding, highly contaminated backside gas conduits, long polishing time and extra material removed. Although it is contemplated the method may be performed using a variety of suitable equipment, the method 500 will be described using the following equipment:

- A 36 inch diameter platen
- A polishing ring assembly (including a ceramic retaining ring 410, a purging fixture 415, an outer drive ring 420, an electrostatic chuck drive plate 430, a plurality of outer weights 440 and inside weights 445 as described with reference to FIG. 4)
- Diamond powder 100 cts: Type MA 30 μm
- Diamond powder 100 cts: Typed MA 3 μm
- LP57 34" OD/12" ID (30 μm)
- LP57 34" OD/12" ID (3 μm)
- Spray Nozzle (30 μm)
- Spray Nozzle (3 μm)
- Spray Bottle (30 μm)
- Spray Bottle (3 μm)
- Hyprez Minimizer and electric dispenser with automatic stirring The method 500 begins at block 1, where the electrostatic chuck is prepared for planarization. An inspection may be performed on the electrostatic chuck to locate and record defects in the electrostatic chuck. A measurement may be made of the dielectric thickness across the surface of the electrostatic chuck. In one embodiment, about 21 equally spaced locations are measure for thickness, in microns, using an eddy current meter or other suitable thickness measuring device. The flatness of the electrostatic chuck top "chucking" surface may be measured using a coordinate measuring machine (CMM) with volumetric accuracy of +/−1 μm. In one embodiment, the measurement of flatness may be less than about 10 μm. Additionally, the seal band and mesa profile may be measured using a skidless surface profilometer at about 4 locations on the chucking surface.

The backside gas conduits and other holes in the top surface of the electrostatic chuck are plugged with rubber plugs from the top side of the electrostatic chuck. The electrostatic chuck may be masked around the base with a tape. The tape thickness may be between about 0.005 inches and about 0.007 inches and may wrap over itself slightly. In one embodiment, the outer diameter of the electrostatic chuck may be completely masked with about 1.0 inch of tape overwrap.

At block 2, the pad may be conditioned using chemical mechanical planarization (CMP) conditioners mounted onto a round plate. The outside diameter (OD) of the round plate may be about 11.7 inches. Conditioning may be done before any polishing or planarization takes place to remove dried up slurry or blunt diamonds. In one embodiment, the platen supporting the pad may be driven at about 74 RPM by a motor for about 5 minutes while the CMP conditioners are applied to the pad with a deionized water flow rate of about 400 ml/min to about 500 ml/min.

At block 3, the polishing ring assembly 400 may be installed on the electrostatic chuck 250. A ceramic retaining ring may be placed over the electrostatic chuck. Both the ceramic retaining ring and electrostatic chuck are flipped onto the polishing pad so that the top surface of the electrostatic chuck is in contact with the polishing pad. A plurality of outer drive rings are placed on top of the ceramic retaining ring. The outer drive rings are rotated on the ceramic retaining ring to allow pins in the outer drive ring to align with receivers in the ceramic retaining ring. Upon alignment, the outer drive ring and the ceramic retaining ring become flush and lock the rotation of the outer drive ring and the ceramic retaining ring with respect to each other.

The electrostatic chuck drive plate is placed on the electrostatic chuck. The electrostatic chuck drive plate has drive pins which aligned with receivers in electrostatic chuck and drive keys which align with a plurality of outer weights placed on top of the outer drive ring. In one embodiment, the outer weights are about 55 lbs to about 56.5 lbs. A plurality of inside weights is placed over the electrostatic chuck drive plate. In one embodiment, the inside weights may range from about 75 lbs to about 93 lbs.

The polishing time should be monitored to prevent rounding of the electrostatic chuck edges. The combined inside weights and outer weights place pressure on both the polishing ring assembly and the electrostatic chuck touching the pad, thus reducing the polishing time required to process the electrostatic chuck on the pad. The polishing becomes more effective by decreasing the contact surface area while increasing contact pressure. In one embodiment the electrostatic chuck has an area of about 107.5 square inches and may be placed in the polishing ring assembly which has a ceramic retaining ring with an area of about 66 square inches. About 57 lbs of weights are placed on the ceramic retaining ring and about 75 lbs of weights are placed on the electrostatic chuck. The weights cause the electrostatic chuck and the ceramic retaining ring to each equally exert about 0.86 PSI of pressure on the pad.

At block 4, the mesas and seal band are removed from the surface of the electrostatic chuck. A pad having a 30 μm diamond grit may be adhered to the platen during the mesa removal operation. A slurry having 30 μm diamond abrasives is provided to the pad remove the mesa's and bring the Ra of the top surface of the electrostatic chuck to an Ra of about 8 micro-inches. The abrasive slurry includes about 1.3 grams to about 1.6 grams of 30 μm diamond powder mixed in about 425 ml to about 450 ml of deionized water. The 30 μm diamond slurry may be mixed in an auto stirrer, or other suitable mixing device, before spraying with a 30 μm spray nozzle onto the 30 μm diamond pad. The spray nozzle may be pointed towards the center track of the pad, and the slurry may be sprayed onto the pad for about 8 seconds over about 25 second intervals. The slurry flow rate may range from about 9 ml/minute to about 10 ml/minute. The platen supporting the 30 μm diamond pad may be driven at about 54 RPM by a motor. A bright LED light may be used to inspect for remaining mesas on the electrostatic chuck. The estimated time for removing the mesas on the electrostatic chuck may be about 25 minutes to about 1.75 hours.

The backside gas conduits are purged with deionized water after removing the electrostatic chuck from the pad. In one embodiment the backside gas conduits are purged for about 1 minute. The purging of the gas conduits with the deionized water prevents the slurry from drying in the holes of the backside gas conduits. The electrostatic chuck may then be rinsed for about 5 minutes and the surface of the electrostatic chuck may be cleaned with a sponge and wiped dry with clean room wipes.

A surface roughness of the top surface of the electrostatic chuck may be measured using a skidless surface profiler, or other suitable measuring device, at a plurality of locations uniformly distributed on the electrostatic chuck surface. In one embodiment, the surface roughness is measured at about 17 locations along the electrostatic chuck surface. The surface roughness (Ra) after polishing with the 30 μm diamond pad and the 30 μm diamond slurry should be about 10 μin to about 13 μin. If the surface roughness is higher than about 13 μin at any one measured location, then polishing should continue until all of the surface roughnesses measured at the different locations are no higher than about 13 μin.

The pad used to remove the mesas, and other surface features of the electrostatic chuck, may be removed from the platen. The 30 μm diamond nozzle for the slurry may be removed and the platen may be cleaned by removing any adhesive or dirt. A polishing pad may be installed in a flat manner such that no bubbles are trapped under the pad. The polishing pad may have an abrasive surface that includes 3 μm diamond grit or other suitable abrasive. The pad is aligned on the platen prior to beginning the conditioning on the pad. The pad is then conditioned by driving the platen at about 90 RPM with a motor for about 5 minutes, while the pad is conditioned using CMP-type conditioners.

At block 5, the electrostatic chuck is planarized using a slurry having 3 μm diamond abrasives. The slurry may include about 1.3 grams to about 1.6 grams of 3 μm diamond powder mixed with about 425 ml to about 450 ml of deionized water to form the 3 μm diamond slurry. The slurry may be mixed in the auto stirrer, or other suitable device, to make the slurry suitable for spraying from a 3 μm slurry nozzle. The slurry nozzle may be directed such that the sprayed slurry contacts the center of the pad, for example, about 1 inch from the center of the pad. The slurry may be sprayed continuously for approximately about 8 seconds over about 25 second intervals. In one embodiment, the 3 μm diamond slurry may be sprayed onto the center of a 3 μm diamond pad rotating at 54 RPM. The slurry flow rate may range from about 5 ml/minute to about 50 ml/minute. The electrostatic chuck, which has about 56.5 lbs of outer weights and about 75 lbs of inner weights, is polished on the 3 μm diamond pad for about 60 minutes prior to rinsing for about 5 minutes.

After removing the electrostatic chuck from the 3 μm diamond pad, the backside gas conduits are immediately purged with deionized water. In one embodiment, the backside gas conduits are purged for about 1 minute. The deionized water removes the slurry from the conduits and prevents clogging of the conduits from dry slurry. The front side surface of the electrostatic chuck may be cleaned with a sponge. Additional cleaning with $Al_2O_3$ 600 grit dressing sticks may be performed until all slurry residues have been removed. The backside gas conduits and electrostatic chuck surface may be blow dried with clean dry air as well as wiped dry with clean room wipes.

The surface roughness may be measured using a skidless surface profiler, or other suitable measuring device. The measurements may be taken at about 17 uniformly distributed locations along the electrostatic chuck surface. The surface roughness at each of the measured locations should range between about 6 μin and about 9 μin. The electrostatic chuck may repeat planarization as described in block 5 until all measured surface roughness locations are less than about 9 μin.

The dielectric thickness may be again measured at equally spaced locations using an eddy current meter or other suitable thickness measuring device. In one embodiment, the flatness of the electrostatic chuck top "or chucking" surface may be measured at about 21 uniformly distributed locations using the CMM along the surface of the electrostatic chuck. The electrostatic chuck may repeat the planarization process as described in step 5 until all flatness measurements are less than about 10 μm.

At block 6, the polishing ring assembly may be removed from the pad and electrostatic chuck. The plurality of outer weights and inside weights are first removed. The electrostatic chuck drive plate may be removed along with the drive pins and keys. The outer drive ring may be removed prior to flipping the electrostatic chuck over (i.e., to orient the top surface up) to remove the ceramic retaining ring. During electrostatic chuck removal, caution is taken in pulling the electrostatic chuck away from the pad as a vacuum between the electrostatic chuck and the pad may prove difficult and damage to the surface of the electrostatic chuck can easily occur.

At block 7 the electrostatic chuck may be packaged. The packaged electrostatic chuck is ready for the final polishing.

The method 600 for polishing either a new or refurbished electrostatic chuck is described with the flow diagram of FIG. 7. The electrostatic chuck is ready for a final polishing wherein all surface features, such as the mesas and the seal band are not present and have yet to be formed thereon. Although it is contemplated the method may be performed using a variety of suitable equipment, it will be described using the following equipment:

A 36 inch diameter platen

A polishing ring assembly 400 (including ceramic retaining ring 410, a purging fixture 415, an outer drive ring 420, an electrostatic chuck drive plate 430, a plurality of outer weights 440 and inside weights 445 as shown in FIG. 4)

Hyprez Diamond 0.5(S7520)60-SO slurry approved for semiconductor use

Polishing pad, 34 inch diameter with 12 inch inside diameter; (0.5 µm Slurry Only)

Spray nozzle (0.5 µm slurry only)

Spray bottle (0.5 µm slurry only)

Hyprez Minimizer and electric dispenser with automatic stirring

At block 1, the electrostatic chuck may be inspected. An inspection may be performed on the electrostatic chuck to locate and record defects in the electrostatic chuck. Some of the following measurements may have been taken in the mesa and seal band removal method 500 of FIG. 5 and therefore do not need to be retaken. However, for a new electrostatic chuck the surface roughness may be measured at a plurality of locations uniformly distributed across the surface using a skidless surface profiler or other suitable measuring device. Additionally the edge profile may be measured and recorded at a plurality of locations. In one embodiment, the edge profile may be measure in 4 equidistant locations and the surface roughness may be measured at about 17 uniformly distributed locations along the electrostatic chuck surface.

A 0.5 µm slurry pad (LP57) may be installed and aligned with the platen. However, additional soft slurry pads may be used to polish as well, for example, an unfilled polyurethane pad for semiconductor related materials. The slurry pad may have no fillers, a density ranging from about 0.41 g/cm$^3$—to about 0.61 g/cm$^3$, a shore A hardness of about 65 to about 95, a compressibility of about 4% to about 15% and an elastic rebound of about 80% to about 95%. The slurry pad may be misaligned with the platen by no less than about 5 mm. At block 2, the 0.5 µm pad may be conditioned using chemical mechanical planarization (CMP) conditioners mounted to a round plate. The outside diameter (OD) of the round plate may have a diameter of about 11.7 inches. The outside diameters of CMP conditioning disks are tangent to the round plate. Conditioning may be performed before polishing or planarization to remove dried slurry or blunt diamonds. In one embodiment, the platen supporting the pad may be driven at about 74 RPM by a motor for about 5 minutes while the CMP conditioners are applied to the pad in the presence of deionized water provided at a flow rate of about 400 ml/min to about 500 ml/min.

At block 3, the electrostatic chuck may be prepared for polishing. The backside gas conduits and other holes in the top surface of the electrostatic chuck are plugged with rubber plugs from the top side of the electrostatic chuck. The electrostatic chuck may be masked around the base with a tape. The tape thickness may be between about 0.005 inches and about 0.007 inches and may wrap over itself slightly. In one embodiment, the outer diameter of the electrostatic chuck may be completely masked with about 1.0 inch of tape overwrap.

At block 4, the polishing ring assembly may be installed on the electrostatic chuck. The ceramic retaining ring may be placed over the electrostatic chuck. Both the ceramic retaining ring and electrostatic chuck are flipped onto the polishing pad so that the top surface of the electrostatic chuck is in contact with the pad. A plurality of outer drive rings are placed on top of the ceramic retaining ring. The outer drive rings are rotated on the ceramic retaining ring to allow pins in the outer drive ring to align with receivers in the ceramic retaining ring. Upon alignment, the outer drive ring and the ceramic retaining ring become flush and lock the rotation of the outer drive ring and the ceramic retaining ring with respect to each other.

The electrostatic chuck drive plate is placed on the electrostatic chuck. The electrostatic chuck drive plate has drive pins which align with the receivers in electrostatic chuck and drive keys which align with a plurality of outer weights placed on top of the outer drive ring. In one embodiment, the outer weights weigh about 55 lbs to about 56.5 lbs. A plurality of inside weights are placed on the electrostatic chuck drive plate. In one embodiment, the total weight of the inside weights may range from about 75 lbs to about 93 lbs.

The combined inside weights and outer weights results in the polishing ring assembly and the electrostatic chuck exerting equal force against the pad. In one embodiment the electrostatic chuck, having an area of about 107.5 square inches, is placed in the polishing ring assembly with a ceramic retaining ring having an area of about 66 square in. About 57 lbs of weights are placed on the ceramic retaining ring and about 75 lbs of weights are placed on the electrostatic chuck. The weights cause the electrostatic chuck and the ceramic retaining ring to individually exert about 0.86 PSI of pressure on the pad.

At block 5, the electrostatic chuck is polished. A slurry having 0.5 µm diamond abrasives may be mixed by volume with deionized water at about a 1:1 ratio. The slurry may be mixed in the auto stirrer, or other suitable device, to make the slurry suitable for spraying from a nozzle. The nozzle opening may be about 0.030 inches to about 0.040 inches with a corresponding flow rate ranging from about 5 ml/minute to about 50 ml/. The slurry nozzle may be pointed such that the sprayed slurry contacts the pad near the center of the pad. In one embodiment, the slurry nozzle is pointed to spray slurry about 1 inch from center of the pad. The slurry may be sprayed continuously for approximately 8 seconds intervals at about every 25 seconds. In one embodiment, the 0.5 µm diamond slurry may be sprayed onto the pad while the pad is rotating at 54 RPM. The slurry flow rate is about 9 ml/minute to about 10 ml/minute. The electrostatic chuck is pressed against the pad with about 56.5 lbs of outer weights and about 75 lbs of inner weights. The electrostatic chuck may be polished for about 60 minutes to about 90 minutes prior to rinsing for about 5 minutes.

After removing electrostatic chuck from pad, an initial purge of the backside conduits may be performed with deionized water. A final purge may be performed with a purge fixture placed in the backside conduits which purges the backside conduits with deionized water. In one embodiment the backside conduits are purged for about 5 minutes with deionized water. The deionized water removes the slurry from the conduits and prevents the obstruction of the conduits from dry slurry. The front side surface of the electrostatic chuck may be cleaned with a sponge. Additional cleaning with $Al_2O_3$ 600 grit dressing sticks may be performed until all slurry residues have been removed. The electrostatic chuck may be wiped dry with clean room wipes. The backside gas conduits and electrostatic chuck surface may be blow dried with clean dry air. In one embodiment, each backside gas conduit is blown with clean dry air for about 2 minutes.

The surface roughness may be measured using a skidless surface profiler, or other suitable measuring device, at a plurality of locations uniformly distributed on the electrostatic chuck surface. In one embodiment, the surface roughness is measured at about 17 locations along the electrostatic chuck surface. The surface roughness at each of the measured locations should range about less than about 3 µin. The electrostatic chuck may be polishing again using the method described in block 5 for approximately an additional 15 minutes until all measured surface roughness locations are less than about 3 µin. In block 6, the electrostatic chuck, ready for surface features to be formed thereon, such as mesas and a seal band, may be packaged.

The embodiments presented herein provided an apparatus and a method for improving the gas seal on an electrostatic chuck. In particular, an electrostatic chuck that reduces the leak rate for the Helium cooling gas. The electrostatic chuck may be fitted with a polishing ring assembly for the purpose of planarizing and polishing the top surface of the electrostatic chuck. The polished surface provides a smooth sealing surface between a substrate and the electrostatic chuck. The smooth sealing surface reduces the cooling gas leak rate, thereby reducing substrate manufacturing defects and improving the service life of the substrate support assembly while reducing maintenance and manufacturing cost.

While the foregoing is directed to embodiments of the present invention, other and further embodiments of the invention may be devised without departing from the basic scope thereof, and the scope thereof is determined by the claims that follow.

The invention claimed is:

1. A polishing jig assembly for planarizing and polishing a top surface of an electrostatic chuck, comprising:
 a retaining ring assembly comprising:
  a ceramic retaining ring having an inner diameter, a bottom surface and a top surface, the bottom surface configured to lie flush with the top surface of the electrostatic chuck; and
  an outer drive ring adapted to reside on the top surface of the ceramic retaining ring, wherein the outer drive ring and the ceramic retaining ring are locked in rotation, and
 an electrostatic chuck fixture comprising:
  an electrostatic chuck drive plate adjacent to the inner diameter of in the ceramic retaining ring, wherein the electrostatic chuck fixture is secured by the ceramic retaining ring to the retaining ring assembly.

2. The polishing jig assembly of claim 1, wherein the ceramic retaining ring is formed from $Al_2O_3$.

3. The polishing jig assembly of claim 1, further comprising:
 a plurality of outer weights configured to interface with the outer drive ring; and
 a plurality of inside weights configured to interface with the electrostatic chuck drive plate.

4. The polishing jig assembly of claim 3, wherein the outer weights are between about 55 lbs to about 56.5 lbs and the plurality of inside weights is between about 75 lbs to about 93 lbs.

5. The polishing jig assembly of claim 3, wherein the electrostatic chuck fixture further comprises:
 a purging fixture.

6. The polishing jig assembly of claim 5, wherein the outer drive ring is deposed along an outside periphery of the purging fixture.

7. The polishing jig assembly of claim 5, wherein the electrostatic chuck drive plate is stacked on top of the purging fixture and includes a locking mechanism.

8. The polishing jig assembly of claim 7, wherein the locking mechanism secures the electrostatic chuck drive plate, outer weights and the purging fixture together.

9. The polishing jig assembly of claim 8, wherein a portion of the locking mechanism comprises:
 pins and keys.

10. The polishing jig assembly of claim 8, wherein the purging fixture is configured to be disposed along three sides of the electrostatic chuck.

11. The polishing jig assembly of claim 1, wherein the top surface of the ceramic retaining ring is configured to be coplanar with a frontside surface of the electrostatic chuck.

12. A jig assembly for planarizing and polishing a top surface of an electrostatic chuck, comprising:
 a retaining ring assembly comprising:
  a ceramic retaining ring having an inner diameter, a bottom surface and a top surface, the bottom surface configured to lie flush with the top surface of the electrostatic chuck; and
  an outer drive ring adapted to reside on the top surface of the ceramic retaining ring, wherein the outer drive ring and the ceramic retaining ring are locked in rotation,
 an electrostatic chuck fixture comprising:
  an electrostatic chuck drive plate adjacent to the inner diameter of in the ceramic retaining ring, wherein the electrostatic chuck fixture is secured by the ceramic retaining ring to the retaining ring assembly; and
  a purging fixture disposed below the electrostatic chuck drive plate, wherein the purging fixture is configured to be disposed along three sides of the electrostatic chuck and the outer drive ring is deposed along an outside periphery of the purging fixture and;
 a plurality of outer weights configured to interface with the outer drive ring;
 a plurality of inside weights configured to interface with the electrostatic chuck drive plate; and
 a locking mechanism secures the electrostatic chuck drive plate, outer weights and the purging fixture together.

13. The jig assembly of claim 12, wherein the outer weights are between about 55 lbs to about 56.5 lbs and the plurality of inside weights is between about 75 lbs to about 93 lbs.

14. The jig assembly of claim 12, wherein the top surface of the ceramic retaining ring is configured to be coplanar with a frontside surface of the electrostatic chuck.

15. The jig assembly of claim 14, further comprising:
 a fluid connection to a center of the electrostatic chuck drive plate, the fluid connection configured to fluidly connect to backside gas conduits of the electrostatic chuck, wherein a fluid may be pumped from the fluid connection through the backside gas conduits of the electrostatic chuck.

16. The jig assembly of claim 15, wherein the fluid connection is configured to provide approximately 400 to 450 ml/minute of fluid exiting out the frontside surface of the electrostatic chuck.

* * * * *